(12) United States Patent
Lee et al.

(10) Patent No.: US 10,777,993 B2
(45) Date of Patent: Sep. 15, 2020

(54) BLACK BOX APPARATUS FOR ANALYZING CAUSE OF ARC INTERRUPTION

(71) Applicant: HAN SAN AMS TECH CO., LTD., Gunpo-si, Gyeonggi-do (KR)

(72) Inventors: Jun Bae Lee, Seoul (KR); Kyeong Min Hong, Seongnam-si (KR); Jun Hee Cho, Ansan-si (KR)

(73) Assignee: HAN SAN AMS TECH CO., LTD., Gunpo-si, Gyeonggi-Do (KR)

(*) Notice: Subject to any disclaimer, the term of this patent is extended or adjusted under 35 U.S.C. 154(b) by 331 days.

(21) Appl. No.: 15/963,373

(22) Filed: Apr. 26, 2018

(65) Prior Publication Data
US 2018/0316178 A1    Nov. 1, 2018

(30) Foreign Application Priority Data
Apr. 27, 2017    (KR) .......................... 10-2017-0054328

(51) Int. Cl.
*H02H 3/00* (2006.01)
*H02H 3/05* (2006.01)
(Continued)

(52) U.S. Cl.
CPC ......... *H02H 3/05* (2013.01); *G01R 19/16547* (2013.01); *G01R 31/1272* (2013.01);
(Continued)

(58) Field of Classification Search
CPC ........... H02H 1/0015; H02H 3/38; H01H 9/50
See application file for complete search history.

(56) References Cited

U.S. PATENT DOCUMENTS

| 6,259,996 B1* | 7/2001 | Haun | H02H 1/0015 361/63 |
| 2007/0086124 A1* | 4/2007 | Elms | H02H 1/0015 361/10 |

(Continued)

FOREIGN PATENT DOCUMENTS

| KR | 10-2011-0045854 A | 5/2011 |
| KR | 10-2012-0133753 A | 12/2012 |

(Continued)

*Primary Examiner* — Harry R Behm
(74) *Attorney, Agent, or Firm* — Novick, Kim & Lee, PLLC; Jae Youn Kim

(57) ABSTRACT

Provided is a black box apparatus for analyzing a cause of arc interruption including: a controller which is installed on a power supply line and receives data detected from a CT detecting a current, a ZCT detecting a short circuit, and a voltage detector detecting a voltage; and an interruption unit which interrupts a power supply by receive a signal from the controller to operate a switch, in which the controller includes a calculation unit calculating data detected from the CT, the ZCT, and the voltage detector; a determination unit determining whether the arc occurs using the result of the calculation unit; and a storage unit storing data up to a predetermined time before the operation when the interruption unit operates to interrupt the power supply. Therefore, it is possible to accurately analyze reproduction for preventing occurrence of electrical fires and a cause of the arc interruption and determine an unstable condition of a power supply device which instantaneously occurs.

5 Claims, 3 Drawing Sheets

(51) Int. Cl.
*G01R 19/165* (2006.01)
*H02H 1/00* (2006.01)
*G01R 31/12* (2020.01)
*G01R 31/327* (2006.01)
*G01R 31/50* (2020.01)
*G01R 31/333* (2006.01)
*H01H 9/50* (2006.01)

(52) U.S. Cl.
CPC ........... *G01R 31/327* (2013.01); *G01R 31/50* (2020.01); *H02H 1/0015* (2013.01); *H02H 3/00* (2013.01); *G01R 31/333* (2013.01); *H01H 9/50* (2013.01)

(56) References Cited

U.S. PATENT DOCUMENTS

2010/0324747 A1* 12/2010 Lee .................. H02H 3/33
    700/293
2016/0225562 A1* 8/2016 Franks ................ H02H 3/08

FOREIGN PATENT DOCUMENTS

KR    10-2014-0033768 A    3/2014
KR    10-2016-0143256 A    12/2016

* cited by examiner

FIG. 3

BLACK BOX APPARATUS FOR ANALYZING CAUSE OF ARC INTERRUPTION

TECHNICAL FIELD

The present invention relates to a black box apparatus and more particularly, to a black box apparatus for analyzing a cause of arc interruption capable of analyzing a cause of arc interruption by storing data of an instantaneous a voltage, a current, a leakage, an arc current, and the like for a short time before an operating point of an interruption unit and improving reliability of a product by preventing occurrence of electrical fires.

BACKGROUND ART

In modern society, electricity is making people's lives richer and easier. However, as the use of electricity increases, electrical fires frequently occur, which is a problem. According to the statistics, it can be seen that the electrical fire is the highest cause of fires.

In order to prevent such damage, an overload interrupter, a leakage interrupter, and the like need to be installed, but the fires caused by electricity are not reduced. In order to reduce the occurrence frequency of the fires caused by electricity, as a result of examining the causes of electrical fires, it is found that before the electrical fires occur, arcs as primary symptoms occur.

Therefore, in order to reduce the occurrence of the electrical fires, it has become more important to detect whether an arc occurs and interrupt the arc when the arc occurs. In recent years, an interrupter has been developed, in which overvoltage and arc interruption functions are complexly added in addition to the existing short circuit and overload interruption functions.

However, in a conventional interrupter, when the interruption operation is performed due to a short circuit, an overload, or the like, there is a problem in that the operation cause of the interrupter is not precisely determined so that the accident can not be prevented and inconvenience in daily life occurs due to frequent interruption.

In particular, the arc current instantaneously often appears and then disappears within a few microseconds (μs), and repetitive characteristics do not frequently occur. Therefore, when the arc interruption occurs, there is a problem in that it is difficult to distinguish a malfunction characteristic and an arc characteristic of the apparatus, and it is difficult to identify the cause of the interruption because the interruption is often caused by a temporary power instability phenomenon.

Furthermore, if an electric power accident occurs, there may be a discrepancy between a supplier and a recipient regarding the economic loss. In this case, there is a problem in that it is impossible to obtain the data for identifying the cause of the electric power accident and the occurrence process of the electric power accident and thus, disputes between the supplier and the recipient are likely to be prolonged.

The above information disclosed in the background art is only for enhancement of understanding of the background of the present invention and therefore, it should not be construed as the related art that is already known in the related art to those skilled in the art.

DISCLOSURE

Technical Problem

In order to solve the aforementioned problems of the related art, an object of the present invention is to provide a black box apparatus for analyzing a cause of arc interruption capable of accurately analyzing reproduction for preventing occurrence of electrical fires and a cause of the arc interruption by storing data up to a predetermined time when the arc interruption occurs.

Further, another object of the present invention is to provide a black box apparatus for analyzing a cause of arc interruption capable of determining an unstable condition of a power supply device which instantaneously occurs by storing a voltage, a leakage current, a current distortion, a current distortion rate, and an arc current which are constituted by a half-cycle unit.

Other technical objects desired to be achieved in the present invention are not limited to the aforementioned technical objects, and other technical objects which are not described above will be apparent to those skilled in the art from the disclosure of the present invention.

Technical Solution

According to an exemplary embodiment of the present invention, there is provided a black box apparatus for analyzing a cause of arc interruption including: a controller which is installed on a power supply line and receives data detected from a current transformer (CT) detecting a current, a zero current transformer (ZCT) detecting a short circuit, and a voltage detector detecting a voltage; and an interruption unit which interrupts a power supply by receive a signal from the controller to operate a switch, in which the controller includes a calculation unit calculating data detected from the CT, the ZCT, and the voltage detector; a determination unit determining whether the arc occurs using the result of the calculation unit; and a storage unit storing data up to a predetermined time before the operation when the interruption unit operates to interrupt the power supply.

The determination unit may further consider at least one factor of overload, leakage, and overvoltage.

The black box apparatus may further include a communication unit capable of extracting the data stored in the storage unit to an external device; and a display unit displaying the data to the outside by interlocking with the storage unit.

The communication unit may use at least one of an infrared ray (IR) communication using infrared rays as a transmission medium, a universal asynchronous receiver/transmitter (UART) communication for converting and transmitting parallel data in a serial manner, and a digital to analog converter (DAC) communication for converting and transmitting a digital signal into an analogue signal.

The storage unit may include a voltage storage unit detecting and storing instantaneous voltage data for a half cycle; a current storage unit detecting and storing instantaneous current data a half cycle; a current distortion storage unit detecting and storing current distortion data for a half cycle; a current distortion rate storage unit detecting and storing current distortion rate data for a half cycle; an arc current storage unit detecting and storing an arc current; and an overload current storage unit detecting and storing an overload current.

The storage unit may store data selected from a range of 20 to 40 pieces constituted by a half-cycle unit before the operation of the interruption unit.

Advantageous Effects

According to the present invention having the above-described configuration, since the operation cause may be accurately determined at the time of the operation of the interrupter, it is possible to perform reproduction for preventing electric fires and improve reliability for a product.

In particular, according to the present invention, when the arc interruption occurs, the cause of the interruption may be accurately identified by distinguishing a malfunction characteristic and an arc characteristic of the apparatus and the user can easily confirm the cause of the interruption by storing a power supply condition before the interruption time.

In addition, according to the present invention, waveforms of a current, a voltage, and a current distortion of each half-cycle of the power supply are stored to determine and analyze the power supply abnormality and unstable condition, thereby estimating whether the interrupter operates by any load characteristic.

As a result, according to the present invention, since the arc interrupter is used for prevention of fires and may determine the fire cause, it is possible to enhance the reliability of a product, reduce a load on the AS, and exert excellent performance in preventing an electric fire accident.

DESCRIPTION OF DRAWINGS

FIG. 3 is an exemplary diagram of data stored in the storage unit according to the exemplary embodiment of the present invention.

MODES OF THE INVENTION

Figure 1:
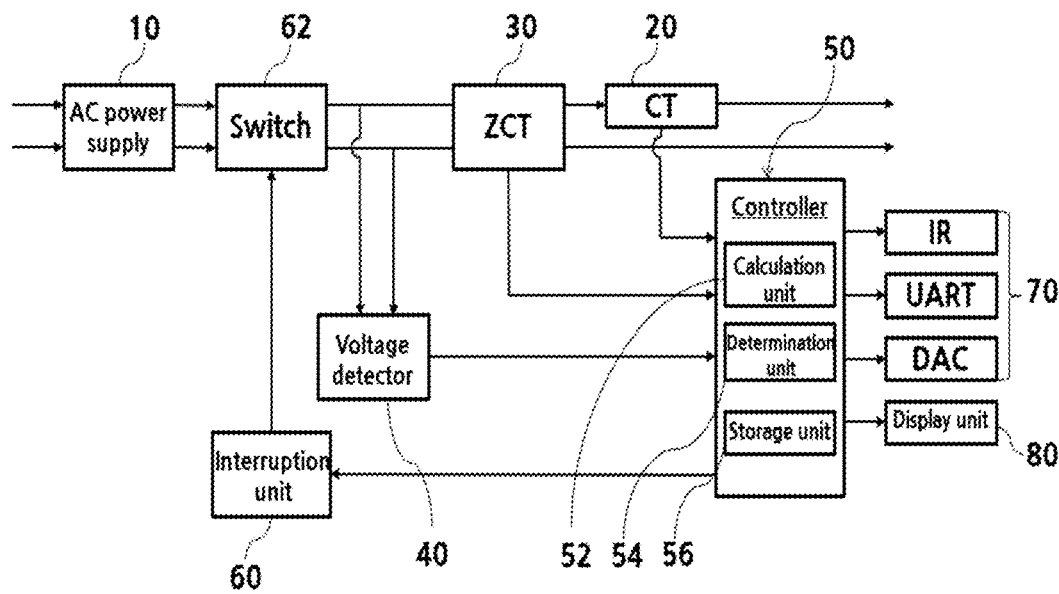
FIG. 1 is a configuration diagram illustrating each configuration of a black box apparatus for analyzing a cause of arc interruption according to an exemplary embodiment of the present invention.

The present invention will be described more fully hereinafter with reference to the accompanying drawings, in which exemplary embodiments of the present invention are shown. However, the present invention can be realized in various different forms, and is not limited to the exemplary embodiments described herein.

In order to clearly describe the present invention, portions which are not related to the description will be omitted. Like reference numerals designate like or similar components throughout the specification.

Terms or words used in this specification and claims should not be interpreted as being limited to typical or dictionary meanings, but should be interpreted as having meanings and concepts which comply with the technical spirit of the present invention, based on the principle that an inventor can appropriately define the concept of the term to describe his/her own invention in the best manner.

FIG. 1 is a configuration diagram illustrating each configuration of a black box apparatus for analyzing a cause of arc interruption according to an exemplary embodiment of the present invention.

As illustrated in FIG. 1, a black box apparatus for analyzing a cause of arc interruption according to the present invention includes a current transformer (CT) 20, a zero current transformer (ZCT) 30, and a voltage detector 40, which are installed on an AC power supply 10 line.

The CT 20 is a current transformer for an instrument of detecting the current according to a unique magnification characteristic in proportional to current flowing in the line and is used by winding a primary coil having a small number of windings and a secondary coil having a large number of windings around a laminated core. In the present invention, the CT 20 serves to detect the current to transmit the detected current to a controller 50.

The ZCT 30 uses a principle in which a circular magnetic field generated in a conducting wire through which the current flows is changed in a direction of the current. Since flow directions of the conducting wires through which a load current flows are opposite to each other, the ZCT 30 may detect a leakage current when a synthesized magnetic field becomes '0'. In the present invention, the ZCT 30 serves to detect a short circuit to transmit the detected short circuit to the controller 50.

As such, the data detected from the CT 20, the ZCT 30 and the voltage detector 40 are received by the controller 50, and when an interruption unit 60 operates by receiving a signal from the controller 50, a switch 62 operates to interrupt the power supply 10.

The controller 50 includes a calculation unit 52 calculating the data detected from the CT 20, the ZCT 30 and the voltage detector 40, a determination unit 54 determining whether the arc occurs using the result of the calculation unit 52, and a storage unit 56 storing the data up to a predetermined time before the operation of the interruption unit 60 when the interruption unit 60 operates to interrupt the power supply 10.

The determination unit 54 may further consider at least one factor of overload, leakage, and overvoltage to determine whether the arc occurs, and thus, the cause of the arc may be more clearly identified.

The storage unit 56 stores data up to a predetermined time before the interruption unit 60 operates to accurately identify the cause of the interruption, and the user may determine a cause of the fire to prevent the electrical fire.

In the case of a conventional storage device, it is difficult to determine an unstable part of a power supply device that instantaneously occurs by storing an average characteristic value of the current or voltage. However, there is a difference in that the storage unit 56 according to the present invention may accurately determine an unstable condition of the power supply device by storing waveforms for the current, the voltage, and current distortion, and the like in each half cycle.

Further, the present invention may further include a communication unit 70 capable of extracting the data stored in the storage unit 56 to an external device and a display unit 80 displaying the data to the outside by interlocking with the storage unit 56.

The display unit 80 may include an LED or the like to provide an external expression so that the user can easily recognize the operation of the interruption unit 60 from the outside. In addition, the display unit 80 may be connected to a touch screen or the like so that the user can easily confirm the data from the outside and easily operate each configuration.

The communication unit 70 may use at least one of an infrared ray (IR) communication using infrared rays as a transmission medium, a universal asynchronous receiver/transmitter (UART) communication for converting and transmitting parallel data in a serial manner, and a digital to analog converter (DAC) communication for converting and transmitting a digital signal into an analogue signal, but the present invention is not limited thereto.

Figure 2:
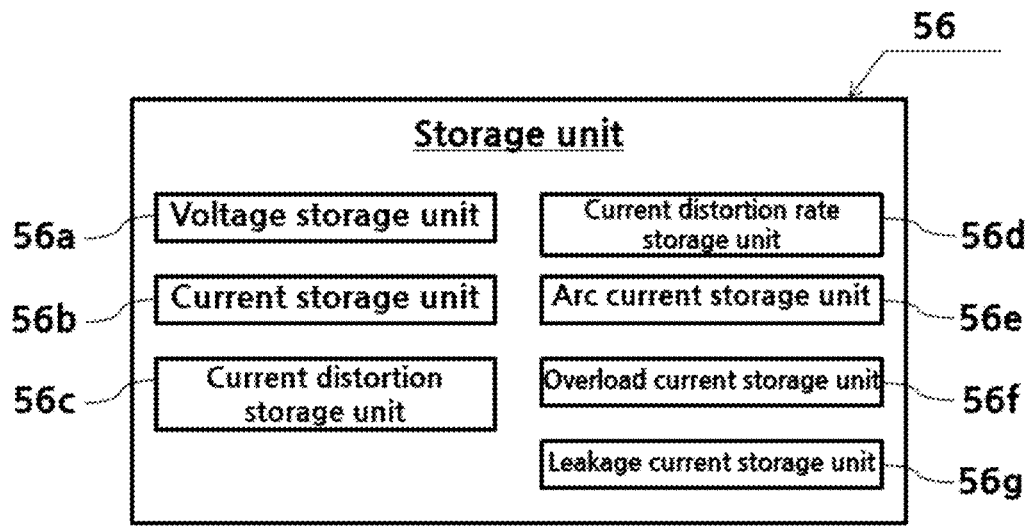
FIG. 2 is a configuration diagram illustrating an appearance of a storage unit according to the exemplary embodiment of the present invention.
Figure 3:
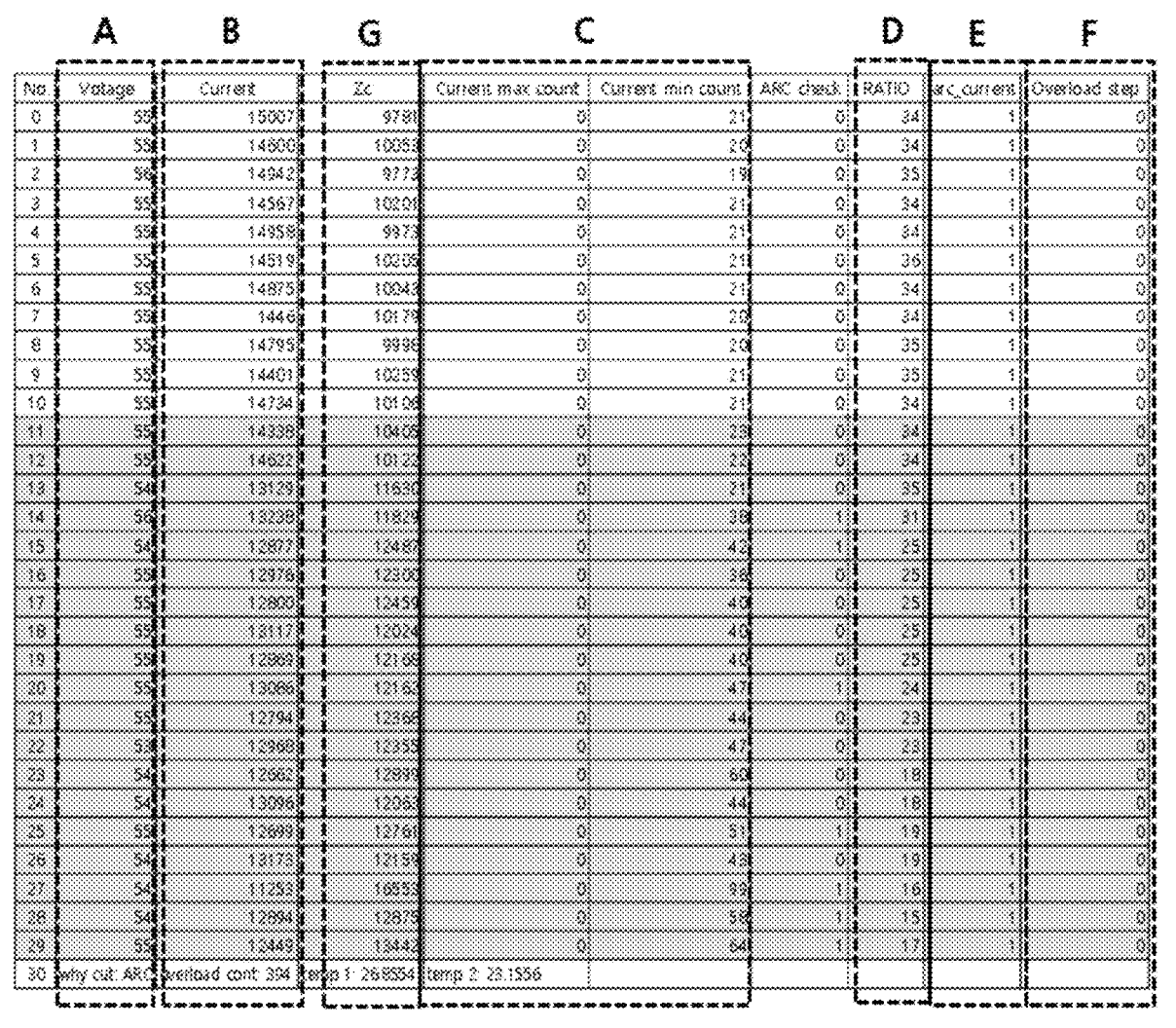
Figure 4:
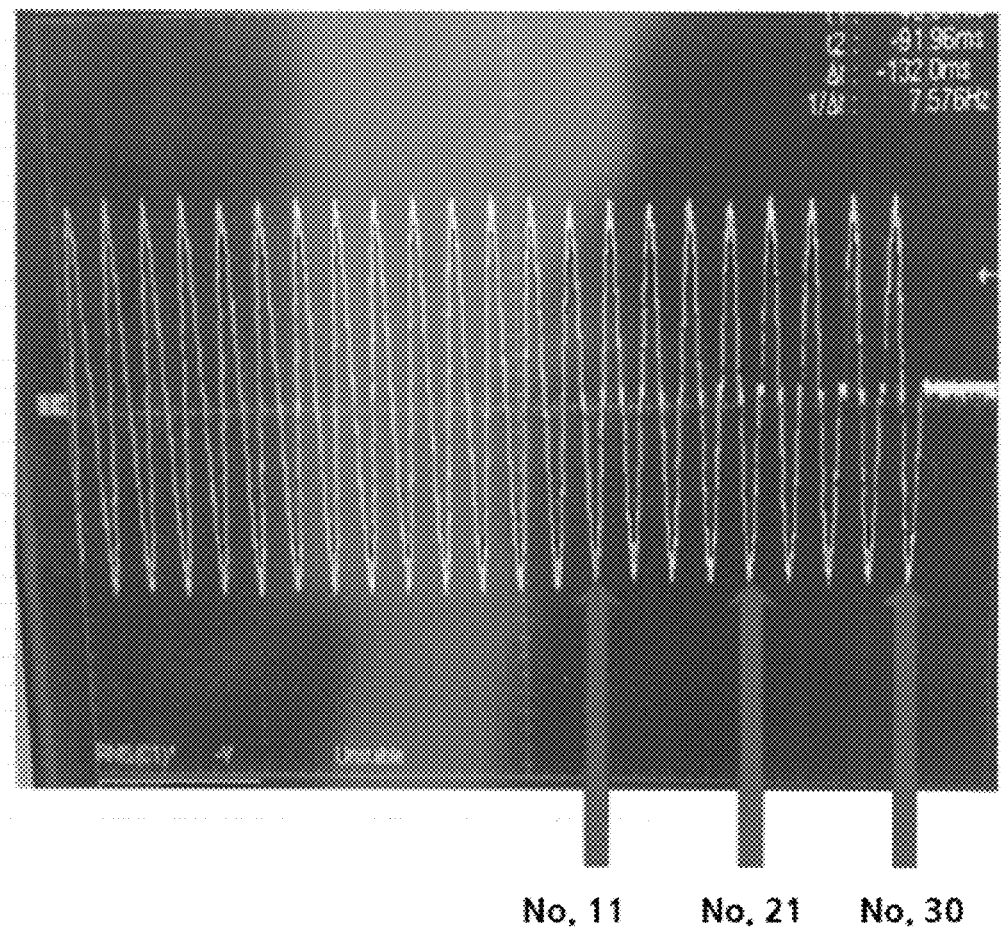
FIG. 4 is an exemplary diagram of waveforms stored in the storage unit according to the exemplary embodiment of the present invention.

FIG. 2 is a configuration diagram illustrating an appearance of a storage unit according to the exemplary embodiment of the present invention, FIG. 3 is an exemplary diagram of data stored in the storage unit according to the exemplary embodiment of the present invention, and FIG. 4 is an exemplary diagram of waveforms stored in the storage unit according to the exemplary embodiment of the present invention.

As illustrated in the drawings, the storage unit 56 includes a voltage storage unit 56a detecting and storing instantaneous voltage data for a half cycle, a current storage unit 56b detecting and storing instantaneous current data a half cycle, a current distortion storage unit 56c detecting and storing current distortion data for a half cycle, a current distortion rate storage unit 56d detecting and storing current distortion rate data for a half cycle, an arc current storage unit 56e detecting and storing an arc current, and an overload current storage unit 56f detecting and storing an overload current.

That is, the storage unit 56 according to the present invention stores data such as an instantaneous voltage, a current, a leakage, and a distortion waveform according to an arc operation for each half-cycle for a short time immediately before the interruption unit 60 operates to analyze the operation cause of the interrupter.

In FIG. 3, a part 'A' is an example of data detected and stored by the voltage storage unit 56a as instantaneous voltage data for a half cycle, and a part 'B' corresponds to instantaneous current data for a half cycle and is detected and stored by the current storage unit 56b.

A part 'G' corresponds to instantaneous leakage current data for a half cycle and is stored by the leakage current storage unit 56g.

A part 'C' is an example of current distortion data for a half cycle which is detected and stored by the current distortion storage unit 56c. The current distortion refers to distortion of the current which does not have a regular shape due to various factors such as an unbalanced load, and is used for determining abnormality or an unstable part of the power supply. A part 'D' is an example of data detected and stored by the current distortion rate storage unit 56d.

A part 'E' is detected and stored by the arc current storage unit 56e as arc current data. The arc current is a current that occurs for several microseconds (μs) after being electrically discharged by a voltage drop caused by contact of two electrodes such as electric wirings. The arc current is a parallel arc occurring between a conducting wire and a neutral end, a series arc occurring when the conducting wire is disconnected or loosely connected to an electric device, and a ground arc generated between the neutral end and a ground end.

As shown in the illustrated exemplary embodiment, the arc current storage unit 56e stores arc current data indicated by 0 or 1, and when the arc current is continuously generated several times or more, the controller 50 determines that the arc current is continuously generated to operate the interruption unit 60. For example, if the arc current is continuously detected 30 times or more, the interruption unit 60 may operate to interrupt the power supply 10.

In the arc interruption, it is difficult to distinguish the malfunction characteristic of the apparatus from the arc characteristic of the apparatus in many cases and it is difficult to distinguish the cause of the interruption because the occurrence of the arc interruption is often caused by a temporary power unstable phenomenon. However, such a problem may be solved in the storage unit of the present invention.

A part 'F' of FIG. 3 is an example of data detected and stored by the overload current storage unit 56f as overload current data, and is indicated by 0 or 1 depending on whether an overload current has occurred.

As described above, the storage unit 56 may determine an interruption time using the data before the interruption time, measure an arc change rate at the time of occurrence of the arc, and determine the interruption cause by determining a current change amount, a current level, a voltage, occurrence of the leakage, and the like at the time of occurrence of the arc. Furthermore, the storage unit 56 may also determine the interruption cause by determining characteristic data such as a current level, a voltage level and a temperature through the data.

Unlike storing the average characteristic value for the current or the voltage in the conventional storage device, the voltage storage unit 56a, the current storage unit 56b, the leakage current storage unit 56g, the current distortion storage unit 56c, the current distortion rate storage unit 56d, the arc current storage unit 56e and the overload current storage 56f store waveforms for the current, the voltage, the leakage current, the current distortion, and the like for each half cycle to accurately determine and analyze abnormality and an unstable condition of the power supply and estimate whether the interrupter operates due to a load characteristic, thereby improving the reliability of the interrupter.

At this time, the storage unit 56 may store data selected from a range of 20 to 40 pieces, which is configured by a half-cycle unit before the operation of the interruption unit 60. For example, as illustrated in FIG. 3, the storage unit 56 may store 30 pieces of data.

According to the present invention having the above-described configuration, since the cause of operation may be accurately determined at the time of the operation of the interrupter due to leakage, overload, overvoltage, and arc, it is possible to perform reproduction for preventing electric fires and improve reliability for the product.

In particular, according to the present invention, when the arc interruption occurs, the cause of the interruption may be accurately identified by distinguishing the malfunction characteristic and the arc characteristic of the apparatus and the user can easily confirm the cause of the interruption by storing a power supply condition before the interruption time.

In addition, according to the present invention, waveforms of a current, a voltage, and a current distortion of each half-cycle of the power supply are stored to determine and analyze the power supply abnormality and unstable condition, thereby estimating whether the interrupter operates by any load characteristic.

As a result, according to the present invention, since the arc interrupter is used for prevention of fires and may further determine the fire cause, it is possible to improve the reliability of a product, reduce a load on the AS, and exert an excellent performance in preventing an electric fire accident.

The aforementioned present invention is not limited to the aforementioned exemplary embodiments and the accompanying drawings, and it will be obvious to those skilled in the technical field to which the present invention pertains that various substitutions, modifications, and changes may be made within the scope without departing from the technical spirit of the present invention.

EXPLANATION OF REFERENCE NUMERALS
AND SYMBOLS

| | |
|---|---|
| 10: Power supply | 20: CT |
| 30: ZCT | 40: Voltage detector |
| 50: Controller | 52: Calculation unit |
| 54: Determination unit | 56: Storage unit |
| 56a: Voltage storage unit | 56b: Current storage unit |
| 56c: Current distortion storage unit | 56d: Current distortion rate storage unit |
| 56e: Arc current storage unit | 56f: Overload current storage unit |
| 60: Interruption unit | 62: Switch |
| 70: Communication unit | 80: Display unit |

The invention claimed is:

1. A black box apparatus for analyzing a cause of arc interruption comprising:

a controller which is installed on a power supply line and receives data detected from a current transformer (CT) detecting a current, a zero current transformer (ZCT) detecting a short circuit, and a voltage detector detecting a voltage; and an interruption unit which interrupts a power supply by receiving a signal from the controller to operate a switch, wherein the controller includes:

a calculation unit calculating data detected from the CT, the ZCT, and the voltage detector;

a determination unit determining whether an arc occurs using the calculated data; and a storage unit storing data up to a predetermined time before an operation of the interruption unit when the interruption unit operates to interrupt the power supply, and wherein the storage unit includes:

a voltage storage unit detecting and storing instantaneous voltage data for a half cycle;

a current storage unit detecting and storing instantaneous current data for a half cycle;

a current distortion storage unit detecting and storing current distortion data for a half cycle;

a current distortion rate storage unit detecting and storing current distortion rate data for a half cycle;

an arc current storage unit detecting and storing an arc current; and an overload current storage unit detecting and storing an overload current.

2. The black box apparatus of claim 1, wherein the determination unit further considers at least one factor of overload, leakage, and overvoltage.

3. The black box apparatus of claim 1, further comprising:

a communication unit capable of extracting the data stored in the storage unit to an external device; and a display unit displaying the data stored in the storage unit by interlocking with the storage unit.

4. The black box apparatus of claim 3, wherein the communication unit uses at least one of an infrared ray (IR) communication using infrared rays as a transmission medium, a universal asynchronous receiver/transmitter (UART) communication for converting and transmitting parallel data in a serial manner, and a digital to analog converter (DAC) communication for converting and transmitting a digital signal into an analogue signal.

5. The black box apparatus of claim 1, wherein the storage unit stores data selected from a range of 20 to 40 pieces constituted by a half-cycle unit before the operation of the interruption unit.

* * * * *